US011325370B2

(12) United States Patent
Martin et al.

(10) Patent No.: US 11,325,370 B2
(45) Date of Patent: May 10, 2022

(54) FLUIDIC DIE WITH LOW VOLTAGE MONITORING CIRCUIT INCLUDING HIGH VOLTAGE TOLERANT TRANSISTOR (71) Applicant: Hewlett-Packard Development Company, L.P., Spring, TX (US)

(72) Inventors: Eric Martin, Corvallis, OR (US); James R. Przybyla, Corvallis, OR (US); Rogelio Cicili, San Diego, CA (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/978,223

(22) PCT Filed: May 15, 2018

(86) PCT No.: PCT/US2018/032764
§ 371 (c)(1),
(2) Date: Sep. 4, 2020

(87) PCT Pub. No.: WO2019/221707
PCT Pub. Date: Nov. 21, 2019

(65) Prior Publication Data
US 2021/0053343 A1 Feb. 25, 2021

(51) Int. Cl.
*B41J 2/045* (2006.01)
*B41J 2/14* (2006.01)
(Continued)

(52) U.S. Cl.
CPC .......... *B41J 2/0451* (2013.01); *B41J 2/0455* (2013.01); *B41J 2/0458* (2013.01);
(Continued)

(58) Field of Classification Search
CPC .... B41J 2/0451; B41J 2/16579; B41J 2/0455; B41J 2/0458; B41J 2/14153; B41J 2002/14354
See application file for complete search history.

(56) References Cited

U.S. PATENT DOCUMENTS 7,342,453 B2    3/2008 Amasuga
7,874,631 B2 *  1/2011 Sheahan ................. B41J 2/155
                                                       347/12
(Continued)

FOREIGN PATENT DOCUMENTS

CN    101200142 A    6/2008
CN    104339868 A    2/2015
(Continued)

*Primary Examiner* — Scott A Richmond
(74) *Attorney, Agent, or Firm* — Dicke Billig & Czaja PLLC (57) ABSTRACT A fluidic die including fluid chambers, each including an electrode exposed to an interior of the fluid chamber and each having a corresponding fluid actuator operating at a first voltage level. Monitoring circuitry, operating at a second voltage level lower than the first voltage level, includes a select transistor and a pulldown transistor for each fluid chamber to selectively couple to the electrode, at least the select transistor being a high voltage tolerant transistor to operate at the second voltage in a normal operating condition and having a breakdown voltage level greater than the first voltage level to prevent a fault current from flowing into the select transistor from the electrode in a fault condition if the fluid actuator short-circuits to the electrode.

15 Claims, 9 Drawing Sheets

(51) Int. Cl.
*H01L 27/02* (2006.01)
*H02H 3/20* (2006.01)

(52) U.S. Cl.
CPC ....... *B41J 2/04543* (2013.01); *B41J 2/14153* (2013.01); *H01L 27/0266* (2013.01); *H02H 3/20* (2013.01); *B41J 2002/14354* (2013.01); *B41J 2202/18* (2013.01)

(56) References Cited

U.S. PATENT DOCUMENTS

| | | |
|---|---|---|
| 8,573,750 B2 | 11/2013 | Hoisington |
| 8,622,506 B2 * | 1/2014 | Fujisawa ................ B41J 2/1753 347/19 |
| 9,044,936 B2 | 6/2015 | Van et al. |
| 2013/0063525 A1 | 3/2013 | Sieber |
| 2017/0036452 A1 * | 2/2017 | Ge ....................... B41J 2/14153 |

FOREIGN PATENT DOCUMENTS

| | | | |
|---|---|---|---|
| CN | 105827233 A | 8/2016 | |
| CN | 107074271 A | 8/2017 | |
| WO | WO2013055356 | 4/2013 | |
| WO | WO-2013055356 | 4/2013 | |
| WO | 2018/080423 A1 | 5/2018 | |
| WO | 2018/080479 A1 | 5/2018 | |

\* cited by examiner

FLUIDIC DIE WITH LOW VOLTAGE MONITORING CIRCUIT INCLUDING HIGH VOLTAGE TOLERANT TRANSISTOR

BACKGROUND

Fluidic dies may include an array of nozzles and/or pumps each including a fluid chamber and a fluid actuator, where the fluid actuator may be actuated to cause displacement of fluid within the chamber. Some example fluidic dies may be printheads, where the fluid may correspond to ink.

Throughout the drawings, identical reference numbers designate similar, but not necessarily identical, elements. The figures are not necessarily to scale, and the size of some parts may be exaggerated to more clearly illustrate the example shown. Moreover the drawings provide examples and/or implementations consistent with the description; however, the description is not limited to the examples and/or implementations provided in the drawings.

DETAILED DESCRIPTION

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

Examples of fluidic dies may include fluid actuators. The fluid actuators may include thermal resistor based actuators, piezoelectric membrane based actuators, electrostatic membrane actuators, mechanical/impact driven membrane actuators, magneto-strictive drive actuators, or other suitable devices that may cause displacement of fluid in response to electrical actuation. Fluidic dies described herein may include a plurality of fluid actuators, which may be referred to as an array of fluid actuators. An actuation event or firing event, as used herein, may refer to singular or concurrent actuation of fluid actuators of the fluidic die to cause fluid displacement.

In example fluidic dies, the array of fluid actuators may be arranged in sets of fluid actuators, where each such set of fluid actuators may be referred to as a "primitive" or a "firing primitive." The number of fluid actuators in a primitive may be referred to as a size of the primitive. The set of fluid actuators of a primitive generally have a set of actuation addresses with each fluid actuator corresponding to a different actuation address of the set of actuation addresses. In some examples, electrical and fluidic constraints of a fluidic die may limit which fluid actuators of each primitive may be actuated concurrently for a given actuation event. Primitives facilitate addressing and subsequent actuation of fluid actuator subsets that may be concurrently actuated for a given actuation event to conform to such constraints.

To illustrate by way of example, if a fluidic die comprises four primitives, with each primitive including eight fluid actuators (with each fluid actuator corresponding to different one of the addresses 0 to 7), and where electrical and fluidic constraints limit actuation to one fluid actuator per primitive, a total of four fluid actuators (one from each primitive) may be concurrently actuated for a given actuation event. For example, for a first actuation event, the respective fluid actuator of each primitive corresponding to address "0" may be actuated. For a second actuation event, the respective fluid actuator of each primitive corresponding to address "5" may be actuated. As will be appreciated, the example is provided merely for illustration purposes, such that fluidic dies contemplated herein may comprise more or fewer fluid actuators per primitive and more or fewer primitives per die.

Example fluidic dies may include fluid chambers, orifices, and/or other features which may be defined by surfaces fabricated in a substrate of the fluidic die by etching, microfabrication (e.g., photolithography), micromachining processes, or other suitable processes or combinations thereof. Some example substrates may include silicon based substrates, glass based substrates, gallium arsenide based substrates, and/or other such suitable types of substrates for microfabricated devices and structures. As used herein, fluid chambers may include ejection chambers in fluidic communication with nozzle orifices from which fluid may be ejected, and fluidic channels through which fluid may be conveyed. In some examples, fluidic channels may be microfluidic channels where, as used herein, a microfluidic channel may correspond to a channel of sufficiently small size (e.g., of nanometer sized scale, micrometer sized scale, millimeter sized scale, etc.) to facilitate conveyance of small volumes of fluid (e.g., picoliter scale, nanoliter scale, microliter scale, milliliter scale, etc.).

In some examples, a fluid actuator may be arranged as part of a nozzle where, in addition to the fluid actuator, the nozzle includes an ejection chamber in fluidic communication with a nozzle orifice. The fluid actuator is positioned relative to the fluid chamber such that actuation of the fluid actuator causes displacement of fluid within the fluid chamber that may cause ejection of a fluid drop from the fluid chamber via the nozzle orifice. Accordingly, a fluid actuator arranged as part of a nozzle may sometimes be referred to as a fluid ejector or an ejecting actuator.

In one example nozzle, the fluid actuator comprises a thermal actuator which is spaced from the fluid chamber by an insulating layer, where actuation (sometimes referred to as "firing") of the fluid actuator heats the fluid to form a gaseous drive bubble within the fluid chamber that may cause a fluid drop to be ejected from the nozzle orifice, after which the drive bubble collapses. In some examples, a cavitation plate is disposed within the fluid chamber so as to be above the fluid actuator and in contact with the fluid within the chamber, where the cavitation plate protects material underlying the fluid chamber, including the underlying insulating material and fluid actuator, from cavitation forces resulting from generation and collapse of the drive bubble. In examples, the cavitation plate may be metal (e.g., tantalum).

In some examples, a fluid actuator may be arranged as part of a pump where, in addition to the fluidic actuator, the pump includes a fluidic channel. The fluidic actuator is positioned relative to a fluidic channel such that actuation of the fluid actuator generates fluid displacement in the fluid channel (e.g., a microfluidic channel) to convey fluid within the fluidic die, such as between a fluid supply (e.g., fluid slot) and a nozzle, for instance. A fluid actuator arranged to convey fluid within a fluidic channel may sometimes be referred to as a non-ejecting actuator. In some examples, similar to that described above with respect to a nozzle, a metal cavitation plate may be disposed within the fluidic channel above the fluid actuator to protect the fluidic actuator and underlying materials from cavitation forces resulting from generation and collapse of drive bubbles within the fluidic channel.

Fluidic dies may include an array of fluid actuators (such as columns of fluid actuators), where the fluid actuators of the array may be arranged as fluid ejectors (i.e., having corresponding fluid ejection chambers with nozzle orifices) and/or pumps (having corresponding fluid channels), with selective operation of fluid ejectors causing fluid drop ejection and selective operation of pumps causing fluid displacement within the fluidic die. In some examples, the array of fluid actuators may be arranged into primitives.

During operation of a fluidic die, conditions may arise that adversely affect the ability of nozzles to properly eject fluid drops and pumps to properly convey fluid within the die. For example, a blockage may occur in a nozzle orifice, ejection chamber, or fluidic channel, fluid (or components thereof) may become solidified on surfaces within a fluid chamber, such as on a cavitation plate, or a fluid actuator may not be functioning properly.

To determine when such conditions are present, techniques have been developed to measure various operating parameters (e.g., impedance, resistance, current, voltage) of nozzles and pumps using a sense electrode which is disposed so as to be exposed to an interior of the fluid chamber. In one case, in addition to protecting fluid actuators and other elements from cavitation forces, cavitation plates may also serve as such sense electrodes. In one example, the sense electrode may be used to measure an impedance of fluid within the chamber, where such impedance may be correlated to a temperature of the fluid, fluid composition, particle concentration, and a presence of air, among others, for instance.

Drive bubble detect (DBD) is one technique which measures parameters indicative of the formation and collapse of a drive bubble within a fluid chamber to determine whether a nozzle or pump is operating properly. In one example, for a given fluid chamber, during an actuation event, a high-voltage (e.g., 15 V) is applied to the corresponding fluid actuator to vaporize at least one component of a fluid (e.g., water) to form a drive bubble within the fluid chamber. In one example, at one or more selected times after commencement of the firing event (e.g., after the start of formation but before collapse of the drive bubble), low-voltage (e.g., 5 V) DBD monitoring circuitry of the fluidic die selectively couples to the cavitation plate within the fluid chamber. In one example, the DBD monitoring circuitry provides a current pulse to the electrically conductive cavitation plate which flows through an impedance path formed by fluid and/or gaseous material of the drive bubble within the ejection chamber to a reference point (e.g. ground). The low-voltage DBD circuit measures a resulting voltage across the fluid chamber, with the voltage being indicative of the operating condition of the nozzle or pump (e.g., the nozzle/pump is operating properly, a nozzle orifice is plugged, etc.).

In example monitoring circuitry arrangements, including DBD monitoring circuitry, the cavitation plate (or other electrode within the fluid chamber) is connected to a sense node, where portions of the monitoring circuitry may selectively couple to the cavitation plate by selectively coupling to the sense node. In some examples, the DBD monitoring circuitry includes one or more controllable switches (e.g., nFETs, pFETs, etc.) which are enabled to selectively couple to the sense node during a sense operation, but which are otherwise disabled so as to be disconnected therefrom.

In examples, the monitoring circuitry, including the one or more controllable switches, operate at a low voltage level (e.g., 5 V) relative to a high voltage level (e.g., 15 V) at which fluid actuators operate. Although disconnected from sense nodes while a high voltage is being applied to fluid actuators during firing events, monitoring circuitry, including the controllable switches, may nonetheless be exposed to and damaged by overvoltage conditions even when disconnected from a sense node if a fluid actuator short-circuits to a cavitation plate such that the high operating voltage of the fluid actuator is applied to the sense node. Because monitoring circuitry is typically implemented to minimize an amount of silicon area required on a fluidic die, damage from such a fault voltage may not be limited to only those portions of the monitoring circuitry associated with the faulted cavitation plate, but, due to the compact implementation, may cascade to other portions of the monitoring circuit. As a result, damage caused by a fluid actuator short circuit may not only prevent the ability of monitoring circuitry to monitor the nozzle or pump in which the short circuit occurred, but may also prevent the monitoring circuitry from monitoring other nozzles and/or pumps as well (such as all nozzles and pumps of a primitive, for example). In some cases, damage may cascade to portions of the fluidic die beyond the monitoring circuitry and may render the fluidic die inoperable.

Figure 1:
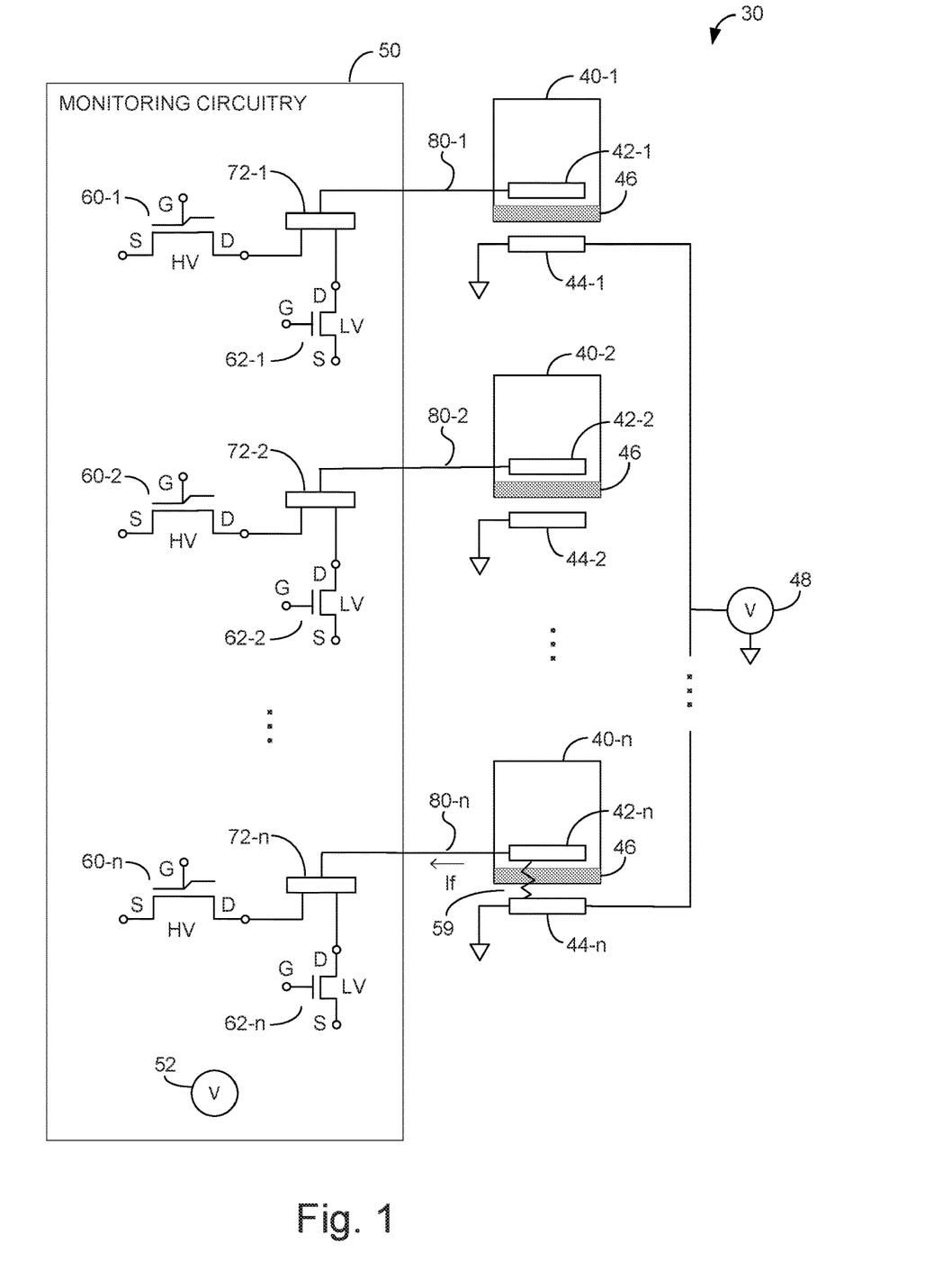
FIG. 1 is a block and schematic diagram illustrating a fluidic die including monitoring circuitry, according to one example.

FIG. 1 is a block and schematic diagram generally illustrating a fluidic die 30, according to one example of the present disclosure, having a plurality of fluid chambers each including an electrode exposed to an interior of the fluid chamber and each having a corresponding fluid actuator operating at a high voltage (e.g., a first voltage level). In one case, each electrode comprises a cavitation plate. In accordance with examples of the present disclosure, fluidic die 30 includes monitoring circuitry operating at a low-voltage relative to the fluid actuator (e.g., a second voltage level) for monitoring operating conditions of each fluid chamber via the corresponding sense electrode. In one example, the low-voltage monitoring circuitry may comprise DBD monitoring circuitry.

In one example, for each fluid chamber, the monitoring circuitry includes a select transistor and a pulldown transistor to selectively connect to the electrode during a sensing operation. In one example, at least the select transistor is a high voltage (HV) tolerant transistor which is exposed to the low operating voltage of the monitoring circuitry under normal operating conditions, but which has a breakdown voltage level (i.e., a drain-to-source voltage, Vds) greater than the high operating voltage of the fluid actuator to prevent the occurrence of a fault current flowing into the select transistor from the electrode under a fault condition that may occur if the fluid actuator short-circuits to the electrode. Although a low-voltage rated device (which is smaller and less costly than a high-voltage tolerant device) would be suitable for use as a select transistor in the low-voltage monitoring circuitry, employing an HV tolerant device prevents a fault current from flowing into the select transistor from the electrode if the fluid ejector short-circuits to the electrode and thereby prevents damage to the select transistor and potentially to other portions of the monitoring circuitry as well and eliminates the requirement of a dedicated fault protection device. In other examples, as will be described in greater detail herein, in addition to the select transistor being a HV tolerant device, the pulldown transistor may also be an HV tolerant device.

In one example, fluidic die 30 includes a plurality of fluid chambers 40 (illustrated as fluid chambers 40-1 to 40-$n$), with each fluid chamber 40 having an electrode 42 (illustrated as electrodes 42-1 to 42-$n$) exposed to an interior thereof. In one example, electrode 42 comprises a cavitation plate disposed at a bottom of fluid chamber 40. Each fluid chamber 42 has a corresponding fluid actuator 44 (illustrated as fluid actuators 44-1 to 44-$n$) which is separated from the fluid chamber 40 and electrode 42, such as by an insulating material 46 (e.g., an oxide layer). In one example, fluid actuators 44 operate at a first voltage 48 (e.g., a high-voltage, such as 32 volts, for instance) and, when actuated, may cause vaporization of a fluid within fluid chamber 40 to form a drive bubble therein. In the case of a nozzle, where fluid chamber 40 is in fluidic communication with a nozzle orifice, formation of a drive bubble via actuation of fluid actuator 44 may cause ejection of a fluid drop (e.g., ink) from fluid chamber 40 via the nozzle orifice. In a case where fluid chamber 40 is a pump, formation of a drive bubble by actuation of fluid actuator 44 may cause conveyance of fluid within fluidic die 30 (e.g., to/from a nozzle).

In one example, fluidic die 30 includes monitoring circuitry 50 for monitoring operating conditions of each fluid chamber 40 of the plurality of fluid chambers, where monitoring circuitry 50 operates at a second voltage 52 (e.g., a low-voltage (relative to fluid actuator 44), such as 5 V, for instance), where low-voltage 52 of monitoring circuit 50 is lower than the high voltage 48 at which fluid actuators 44 operate. In one case, monitoring circuitry 50 may comprise DBD monitoring circuitry. According to one example, for each fluid chamber 40, monitoring circuitry 50 has a transistor pair including a select transistor 60 (illustrated as select transistors 60-1 to 60-$n$) and a pulldown transistor 62 (illustrated as pulldown transistors 62-1 to 62-$n$) which, during a sensing operation, operate to selectively connect to the corresponding cavitation plate 42 via a sense node 72 (illustrated as sense nodes 72-1 to 72-$n$), with each sense node 72 electrically connected to the corresponding cavitation plate 42, such as by a connection 80 (illustrated as connections 80-1 to 80-$n$).

In one example, select and pulldown switches 60 and 62 include a gate (G), a source region (S), and a drain region (D), where one of the source regions (S) and drain regions (D) is electrically connected to sense node 72. In one example, as illustrated, the drain region (D) of each select and pulldown transistor 60 and 62 is connected to sense node 72. In other examples, source regions (S) of select and pulldown transistors 60 and 62 may be coupled to sense node 72 in lieu of drain regions (D).

According to examples, under normal operating conditions, select and pulldown transistors 60 and 62 are exposed to and operate at the low-voltage 52 of monitoring circuitry 50, such as 5 volts, for instance. Although operating at the low-voltage 52 of operating circuitry 50, in one example, as will be described in greater detail herein, at least select transistors 60 comprise HV tolerant transistors, where the one of the source (S) and drain (D) regions connected to sense node 72 have a breakdown voltage (i.e., Vds, a voltage at which a normally non-conducting pn-junction between the one of the source/drain regions and a substrate breaks down and becomes conductive) which is greater than the high voltage 48 at which the fluid actuator 44 of the corresponding fluid chamber 40 operate.

As mentioned above, although a low-voltage (LV) rated device (which is smaller and less costly than a high-voltage tolerant device) would be suitable for use as select transistors 60 in low-voltage monitoring circuitry 50, employing an HV tolerant device prevents a fault current from forming and flowing into select transistor 60 from electrode 42 in the case of the corresponding fluid actuator 44 short-circuiting to the electrode 42, thereby preventing damage to at least the select transistor 60 and potentially to other portions of monitoring circuitry 50 as well.

In one example, as illustrated by FIG. 1, pulldown transistors 62 comprise LV rated devices having a breakdown voltage less than an operating voltage of fluid actuators 44. In other examples, as will be described in greater detail herein, in addition to the select transistors 60 being HV tolerant devices, pulldown transistors 62 may also be HV tolerant devices.

Figure 2:
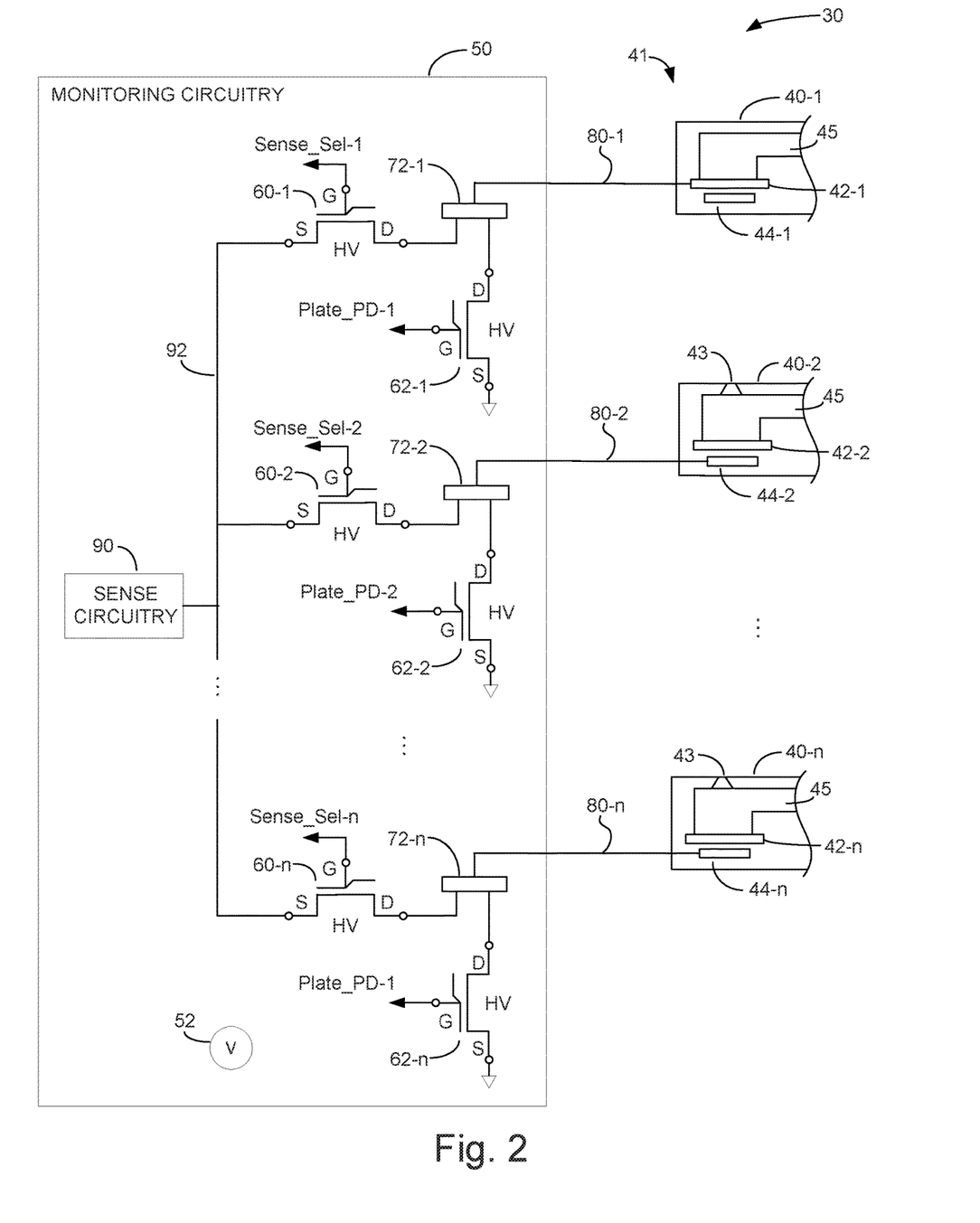
FIG. 2 is a block and schematic diagram illustrating a fluidic die including monitoring circuitry, according to one example.

FIG. 2 is a block and schematic diagram generally illustrating portions of fluidic die 30, according to one example, where the plurality of fluid actuators 44 is arranged to form a primitive 41. In one example, a portion of the fluid actuators 44 may be arranged as part of a nozzle where the corresponding fluid chamber 40 is in fluidic communication with a nozzle orifice 43 (such as illustrated by fluid chambers 40-2 and 40-$n$, for instance), and another portion may be arranged as part of a pump (such illustrated by fluid chamber 40-1, for instance). In one example, each cavitation plate 42 is disposed within the corresponding fluid chamber 40 so as to be exposed to an interior thereof and which may be in contact with a fluid 45 if present therein (e.g., ink).

In one example, each select and pulldown transistor 60 and 62 is a MOS FET (e.g., NMOS, PMOS) having a gate (G), a source region (S), and a drain region (D), with drain region (D) connected to the corresponding sense node 72. In one example, as illustrated, each select and pulldown transistor 60 and 62 is an HV tolerant device having a drain region (D) with a breakdown voltage which is greater than the high-voltage 48 at which the fluid actuator 44 operates. In one case, as illustrated and described in greater detail below by FIG. 4, for example, each select and pulldown FET 60 and 62 comprises a drain-extended nMOS having a low-voltage source (S) and a high voltage drain (D) with a breakdown voltage (a drain-to-source voltage, Vds) greater than the high-voltage 48 of fluid actuators 44. In other examples, the source region (S) may be connected to corresponding sense node 72, in which case the source region (S) would be arranged to have a breakdown voltage greater than the high-voltage of the corresponding fluid actuator 44.

In one example arrangement, monitoring circuitry 50 includes sense circuitry 90, where the source region (S) of each select FET 60 is coupled to sense circuitry 90 via a sense line 92, and where the source region (S) of each pulldown FET 62 is coupled to a reference voltage (e.g., a 0V reference, or ground). Monitoring circuitry 50 further includes a sense select signal (Sense_Sel) to the gate (G) of each select FET 60 (illustrated as sense select signals Sense_Sel-1 to Sense_Sel-n), and a plate pulldown signal (Plate_PD) to the gate (G) of each pulldown FET 62 (illustrated as plate pulldown signals Plate_PD-1 to Plate_PD-n).

According to examples, during firing events of fluid actuators 44 (e.g., to eject fluid via nozzles and convey fluid within fluidic die 30 via pumps), monitoring circuitry 50, via the Plate_PD signals, maintains pulldown FETs 62 in an enabled state (e.g., a closed position) to maintain cavitation plates 42 at a "safe" voltage (e.g., ground), and maintains select FETs 60 in a disabled state (e.g., an open position) to as to isolate sense circuitry 90, from cavitation plates 42. Additionally, during a sensing operation, such as described below, pulldown FETs 62 ensure that sense node 72 is at a known initial reference voltage before enabling select FET 60 to connect to cavitation plate 42 and starting a sense measurement.

During a sensing operation (e.g., a DBD sense operation), according to one example, monitoring circuitry 50 monitors one selected fluid chamber 40 of primitive 41 at a given time. In one example, during a sensing operation, sense circuitry 90 connects to cavitation plate 42 of the selected fluid chamber 40 by enabling the corresponding select FET 60 via the Sense_Sel signal. In one case, after connecting to cavitation plate 42 via select FET 60 of the selected fluid chamber 40, sense circuitry 90 disables the corresponding pulldown FET 62 to disconnect cavitation plate 42 from the reference voltage (e.g., ground). In one example, sense circuitry 90, via cavitation plate 42, then provides a sense current (e.g., a current pulse) through at least a portion of fluid chamber 40 to a reference point (e.g., ground), including, in some examples, through fluid 45 and/or vaporized portions thereof within the selected fluid chamber 40. Sense circuitry 90 monitors a resulting voltage on sense node 72 to evaluate an operating condition of the selected fluid chamber 40.

Space may be limited on fluidic die 30, particularly in regions of fluidic die 30 proximate to fluid chambers 40. In one example, as described in greater detail below, to conserve space, where select and pulldown transistors 60 and 62 are each HV tolerant devices, the pair of select and pulldown transistors 60 and 62 for each fluid chamber 40 may share a drain region (D). In other examples, to further conserve space on fluidic die 30, select FETs 60 of adjacent fluid chambers 40 may share a source region (S), and pulldown FETs 62 of adjacent fluid chambers 40 may share a source region (S).

Figure 3:
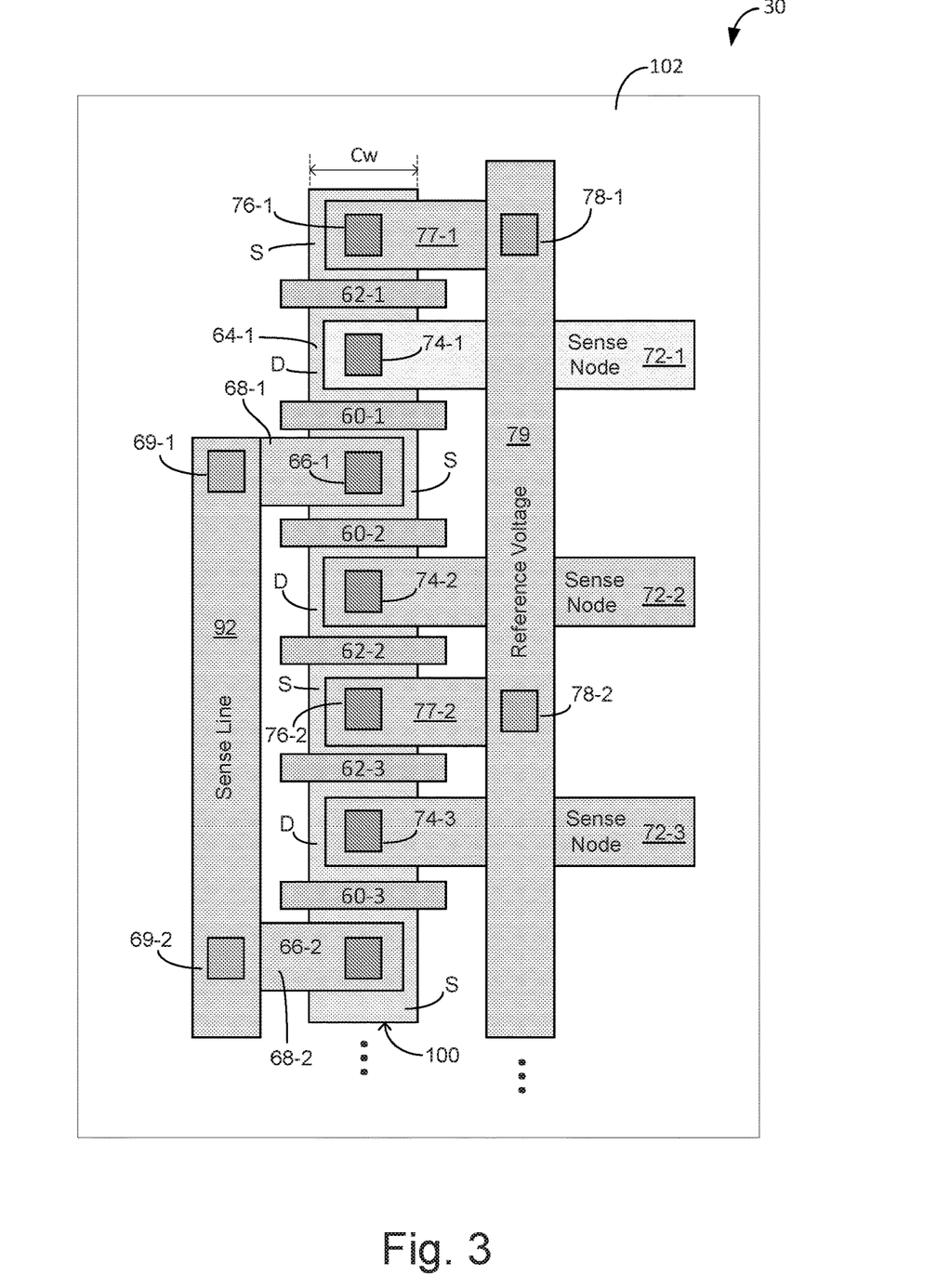
FIG. 3 is a schematic diagram illustrating a plan view of a device and wiring layout of a fluidic die, according to one example.

FIG. 3 is a plan view illustrating a simplified wiring and device layout of a portion of fluidic die 30 of FIG. 2, according to one example, where both select FETs 60 and pulldown FETs 62 are HV tolerant devices having breakdown voltages (Vds) greater than high voltage 48 at which fluid actuators 44 operate. Gates of select and pulldown FETs 60 (e.g., polysilicon material), respectively indicated at 60-1 to 60-3 and 62-1 to 62-3, are illustrated as being disposed over active source and drain regions 100 (implant regions) in a substrate 102 of fluidic die 30, with the active regions alternating as source and drain regions (indicated as "S" and "D"). In a case of select and pulldown FETs 60 and 62 being NMOS FETs, source and drain regions 100 comprise n-doped regions within a p-type substrate 102. Conventionally, as illustrated, source and drain regions 100 are arranged in a column having a width (Cw) which defines a gate width of select and pulldown FETs 60 and 62 (with a gate defined as an overlapping or intersecting region between overlying polysilicon material and underlying active or implant regions).

In one example, to limit space requirements, monitoring circuitry 50, including sense circuitry 90, is shared between fluid chambers 40 of primitive 41, with only one cavitation plate 42 of a selected fluid chamber 40 being coupled to sense circuitry 90 at a given time via control of select and pulldown FETs 60 and 62. Additionally, as described above, with sense and pulldown FETs 60 and 62 being instantiated in a region of high circuit density on fluidic die 30, in some example arrangements, adjacent sense and pulldown FETs 60 and 62 may share drain and source regions 100 and corresponding drain and source contacts to minimize required circuit space.

For instance, as described above, the pair of sense and pulldown FETs 60 and 62 of each fluid chamber 40 share a drain region (D) 64 and drain contact 74, with the shared drain contact 74 being connected to the corresponding sense node 72, such as illustrated by select and pulldown FETs 60-1 and 62-1 sharing drain region (D), as indicated at 64-1, which is electrically connected to sense node 72-1 by shared drain contact 74-1.

In another example, pairs of select FETs 60 of adjacent fluid chambers 40 may share a source region "S" and a source contact 66, such as illustrated by select FETs 60-1 and 60-2 sharing source region "S" and a shared source contact 66-1. In one example, the shared contact 66 is connected to a corresponding source node 68 which, in-turn, is connected to sense line 92 by a via 69, such as illustrated by shared contact 66-1 of select FETs 60-1 and 60-2 being connected to a corresponding source node 68-1 and, in-turn, to sense line 92 by a via 69-1.

In another example, pairs of pulldown FETs 62 of adjacent fluid chambers 40 share a source region "S" and a source contact 76, such as illustrated by pulldown FETs 62-2 and 62-3 sharing source region (S). In one example, shared source contact 76 to a corresponding reference voltage node 77 which, in-turn, is connected to a reference voltage line (e.g., a ground line) 79 by a via 78, such as illustrated by shared source contact 76-2 of pulldown FETs 62-2 and 62-3 being connected to a corresponding reference node 77-2 and, in-turn, to reference voltage line 79 by via 78-2.

It is noted that, according to convention, horizontally and vertically extending conductive traces are arranged in alternating metal layers. For instance, according to one example, horizontally extending conductive traces are arranged in a Metal1 layer (e.g., sense node 72, source node 68, and ground node 77) and vertically extending conductive traces are arranged in a Metal 2 layer (e.g., ground line 79 and sense line 92), and so on.

Figure 4:
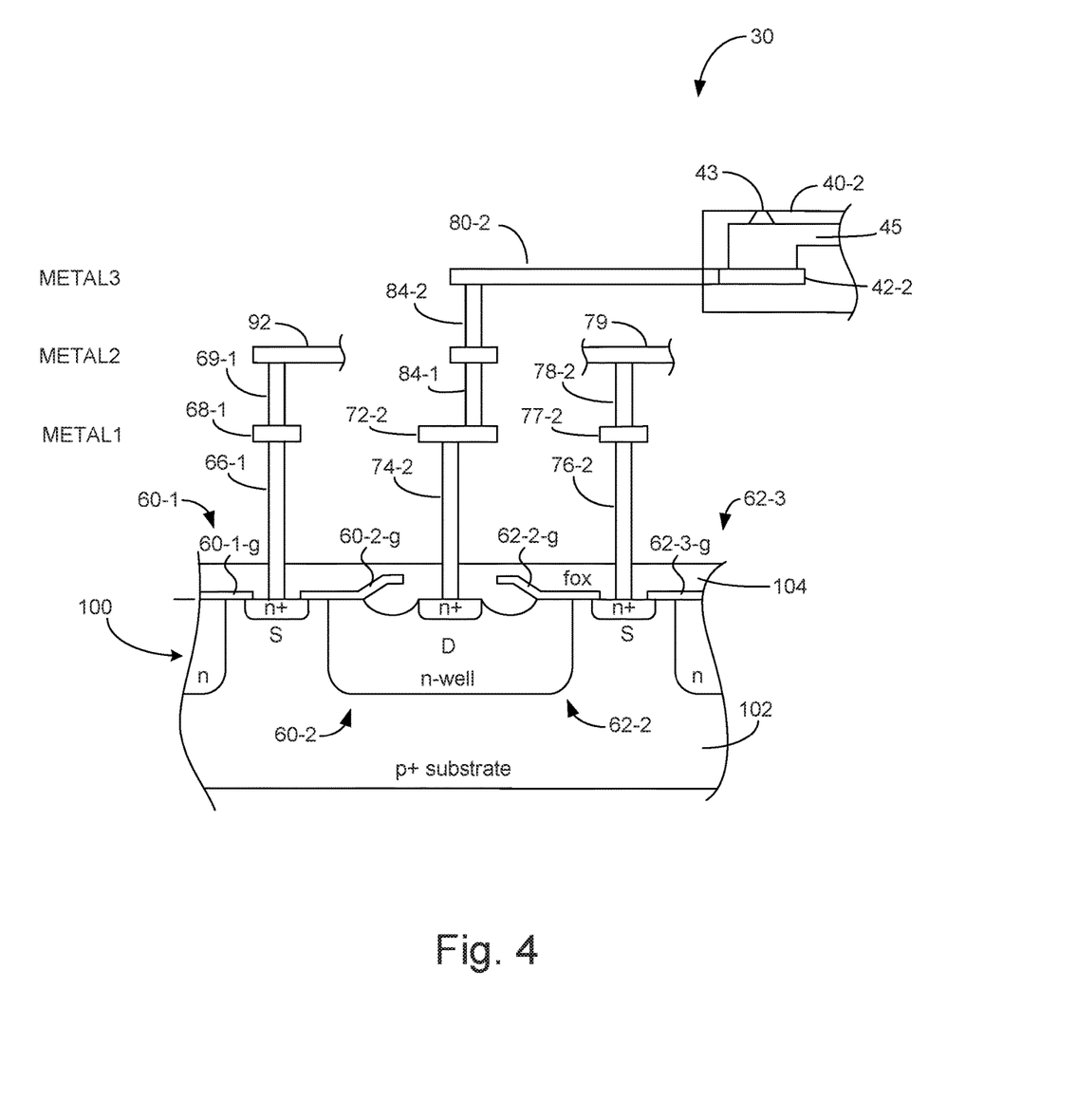
FIG. 4 is a schematic diagram illustrating a cross-sectional view of a device and wiring layout of a fluidic die including a high voltage tolerant drain extended MOSFET, according to one example.

FIG. 4 is a cross-sectional view generally illustrating a simplified device and wiring layout of a portion of fluidic die 30 of FIG. 3, where sense and pulldown FETs 60 and 62 comprise drain-extended HV-tolerant nMOSFETs (metal-oxide-semiconductor field-effect transistors), according to examples of the present disclosure. In the illustrated example, select and pulldown FETs 60-2 and 62-2 share a drain region (D) and drain contact 74-2, with select FET 60-2 further sharing a source region (S) and source contact 66-1 with select FET 60-1, and pulldown FET 62-2 sharing a source region (S) and source contact 76-2 with pulldown FET 62-3. Polysilicon gates of select switches 60-1 and 60-2, and pulldown switches 62-2 and 62-3 are respectively illustrated at 60-1-g, 60-2-g, 62-2-g, and 62-3-g. In one example, as illustrated, the drain-extended nMOSFET has a shared drain region (D) including an n-well region enclosing a more highly doped n+ region proximate to shared drain contact 74-2. A portion of a field oxide layer (FOX) 104 is disposed between the low voltage gates and drain regions (D). A gate oxide layer (not illustrated) is further disposed between the polysilicon gate material and underlying material.

While the source regions (S) of select and pulldown nMOSFETs 60 and 62 are low-voltage rated (at least above the low operating voltage 52 of monitoring circuitry 50), the extended drain regions (D) are HV-tolerant and provide a breakdown voltage (Vds) greater than the high operating voltage 48 of fluid actuators 44. In one example, the breakdown voltage, Vds, is 40 V. In one example, Vds is 60 V.

As illustrated, source contact 66-1 connects the shared source region (S) to source node 68-1 which, in-turn, is connected to sense line 92 by via 69-1. Source contact 76-2 connects the shared source region (S) of pulldown FETs 62-2 and 62-3 to ground node 77-2 which, in-turn, is connected to ground line 79 by via 78-2. Drain contact 74-2 connects the shared drain region "D" of select FET 60-2 and pulldown FET 62-2 to sense node 72-2. Sense node 72-2 is connected to conductor 80-2 disposed in metal3 through metal2 by vias 84-1 and 84-2, with conductor 80-2, in-turn, being connected to cavitation plate 42-2 of fluid chamber 40-2.

With reference to FIGS. 3 and 4, space requirements for monitoring circuitry 50 on fluidic die 30 may be reduced by sharing source "S" and drain "D" contacts between adjacent select and pulldowns FETs 60 and 62. While a compact arrangement reduces required circuit area on fluidic die 30, such a compact arrangement may be susceptible to damage from an overvoltage condition resulting from a short circuit of a fluid actuator 44 to a cavitation plate 42, even when monitoring circuitry 50 is decoupled from sense nodes 72 (i.e., when select and pulldown FETs 60 and 62 are "disabled").

Figure 5:
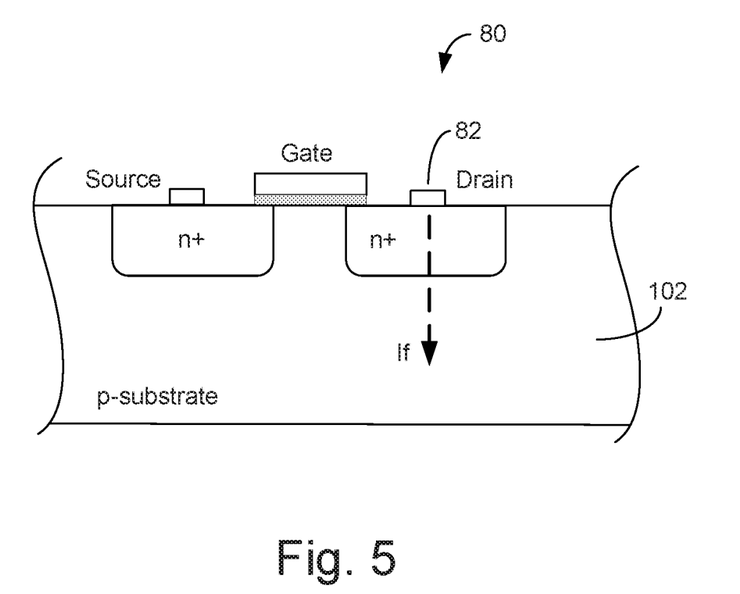
FIG. 5 is a schematic diagram generally illustrating a low-voltage MOSFET, according to one example.

For example, with select FETs 60 and pulldown FETs 62 sharing a drain region and drain contact 74, if a fluid actuator 44 short-circuits to a cavitation plate 42, the shared drain contact 74 may be exposed to the high operating voltage of the fluid actuator 44 (i.e., a fault voltage) via sense node 72. With reference to FIG. 5, which generally depicts a simplified example of a low-voltage FET 80, if a fault voltage at a drain contact 82 results in a breakdown voltage (e.g. Vds) of low-voltage FET 80 being exceeded, a fault current (If) may flow into the drain region via the drain contact 82, where such fault current could potentially damage the drain contact 74, the drain region, and the polysilicon gate, for example.

With reference to FIG. 4, if low-voltage (LV) FETs (such as illustrated by FIG. 5) were employed for select FET 60-2 and pulldown FET 62-2 in lieu of HV-tolerant nMOSFETs in accordance with the present application, a short-circuit of fluid actuator 44-2 to cavitation plate 42-2 of corresponding fluid chamber 40-2 could result in high voltage 48 being applied to shared drain contact 74-2 via conductor 80-2 and sense node 72-2, where such high-voltage could potentially damage both select FET 60-2 and pulldown FET 62-2. If the gate structures of such LV select and pulldown FETs 60-2 and 62-2 were damaged, fault current could also potentially propagate to and damage other portions of monitoring circuitry 50 via Sense_Sel and Plate_PD signal lines, and potentially cascade to circuitry on fluidic die 30 beyond monitoring circuitry 50.

Compromised gate structures could also potentially lead to damage of a source region shared by adjacent select FETs 60, including the shared source contact 66 and source node 68, which could also potentially lead to damage of sense circuitry 90 via sense line 92. Furthermore, a fault current flowing through a drain region and into the underlying substrate may potentially damage that region of the substrate and damage adjacent devices, such as by producing what is referred to as a runaway latch-up current event.

If select FET 60-1 was damaged and unable to isolate sense circuitry 90 from sense node 72-2, monitoring circuitry 50 would be unable to perform monitoring of remaining operational fluid chambers 40 of primitive 41. However, if pulldown FET 62-2 was damaged and rendered inoperable, but select FET 60-1 remained able to isolate sense circuitry 90 from sense node 72-2, monitoring circuitry 50 may be able to continue monitoring other operational fluid chambers 40 of primitive 41 if other portions of monitoring circuitry 50, such as sense circuitry 90, for example, remain undamaged.

With this in mind, as illustrated by FIG. 1, according to one example, a HV-tolerant FET, such as a drain-extended HV-tolerant nMOSFET of FIG. 4, is employed for select FETs 60 of monitoring 50 while a LV FET is employed for pulldown FETs 62. Such an arrangement prevents fault damage to HV-tolerant select FETs 60 while benefitting from a lesser amount of physical space required by LV pulldown FETs 62.

However, as described above, depending a level of a fault voltage, a gate structure of a LV pulldown FET 62 could be damaged so as to potentially result in a fault current propagating through the gate terminal of LV pulldown FET 60 and damaging other portions of monitoring circuitry 50 via the Plate_PD signal lines. In such case, monitoring circuitry 50 would be rendered inoperable to continue monitoring remaining operation fluid chambers 40, even though HV-tolerant select FET 62 remains operational and able to isolate sense circuitry 90 from sense node 72.

With this in mind, according to one example, as illustrated by FIGS. 2-4, HV-tolerant FETs, such as a drain-extended HV-tolerant nMOSFET of FIG. 4, are employed for both select FETs 60 and pulldown FETs 62. By using HV-tolerant FETs having breakdown voltages in excess of the high operating voltage 48 of fluid actuators 44 for both select FETs 60 and pulldown FETs 62, potential fault currents resulting from short-circuits of fluid actuators 44 to cavitation plates 42 are eliminated from flowing into monitoring circuitry 50. Although HV-tolerant FETs require more physical space on fluidic die 30 than LV FETs, HV-tolerant FETs eliminate the need for a separate fault current protection device.

Figure 6:
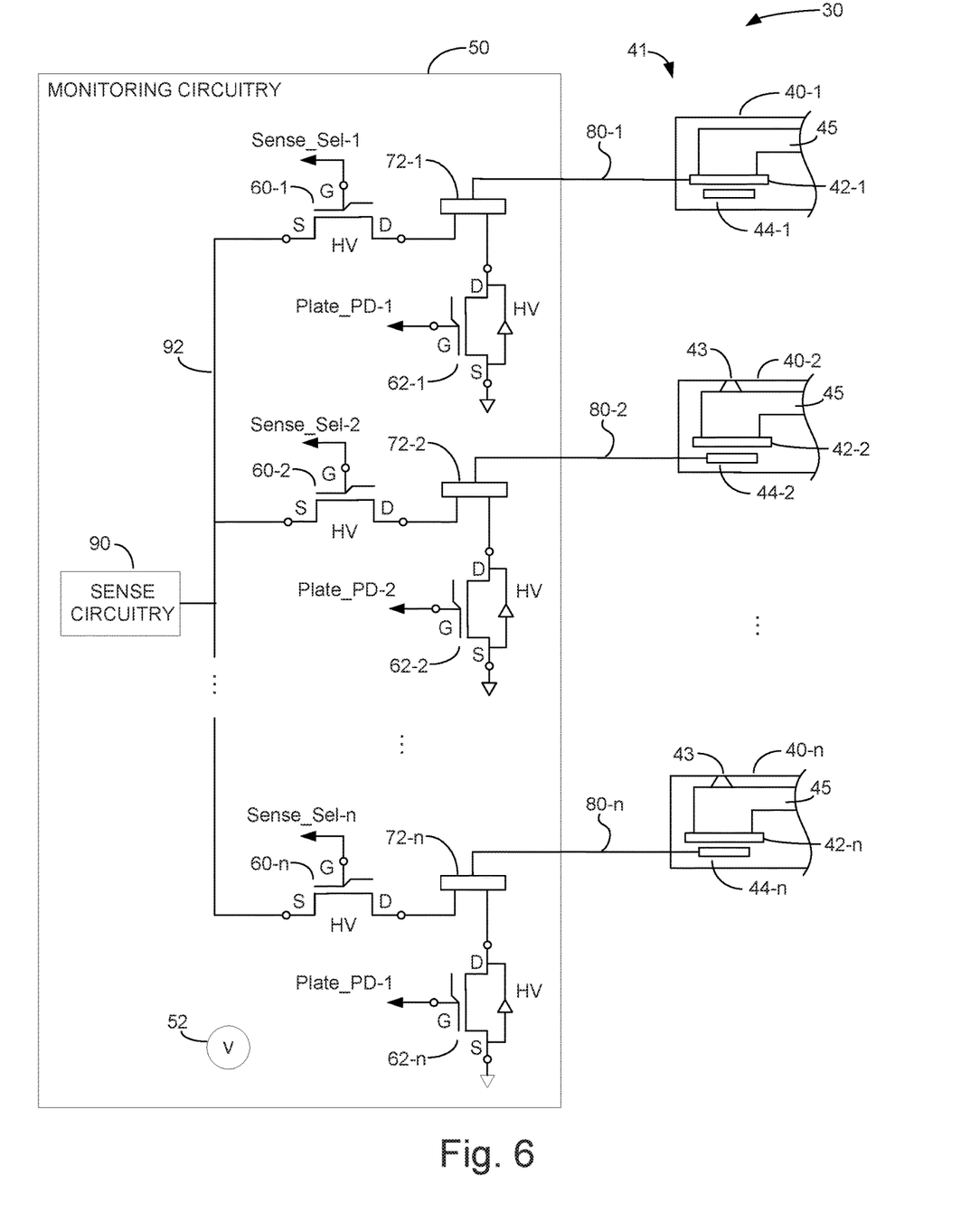
FIG. 6 is a block and schematic diagram illustrating a fluidic die including monitoring circuitry, according to one example.

FIG. 6 is a block and schematic diagram generally illustrating fluidic die 30 including low-monitoring circuitry 50, according to one example of the present disclosure. Monitoring circuitry 50 of FIG. 6 is similar to that of FIG. 2, where select and pulldown FETs 60 and 62 are HV-tolerant devices. However, in contrast to the example of FIG. 2, pulldown FETs 62 comprise HV-tolerant SGLDMOSFET (single-gate laterally-diffused metal-oxide field effect transistor) devices in lieu of HV-tolerant nMOSFET devices.

Figure 7:
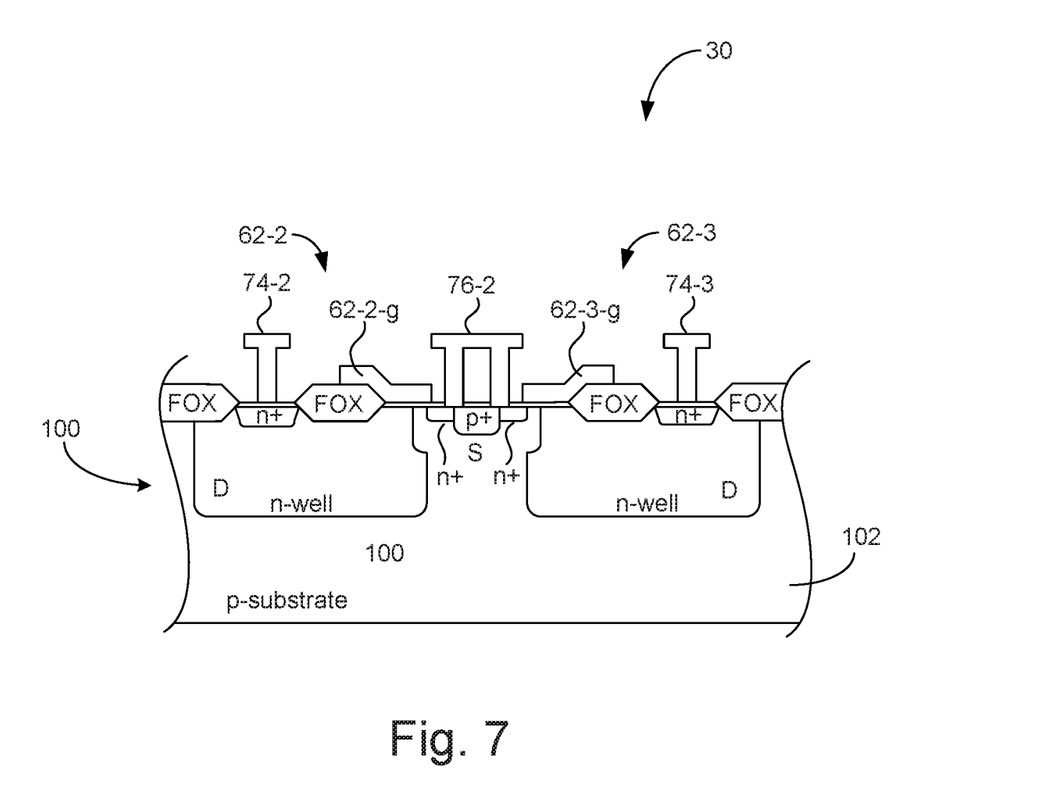
FIG. 7 is a schematic diagram illustrating a cross-sectional view of a device and wiring layout of a fluidic die including a high voltage tolerant SGLDMOSFET, according to one example

FIG. 7 is a cross-sectional view illustrating a portion of a simplified wiring and device layout of fluidic die 30 of FIG. 3 where HV-tolerant SGLDMOSFET devices are employed for pulldown FETs 62. In particular, FIG. 7 illustrates pulldown FETs 62-2 and 62-3, where such FETs share a source region (S) and source contact 76-2. In contrast to the HV-tolerant drain-extended nMOSFETs employed at least for select FETs 60, a body contact (not illustrated) of the HV-tolerant SGLDMOSFET devices employed for pulldown FETs 62 is shorted to the source contact. As a result, the HV-tolerant SGLDMOSFET device includes a back-body diode that may allow a source-to-drain current to flow if a voltage level on the source contact is above a voltage level on the drain contact by more than a threshold voltage (Vth) of the device (i.e., a voltage at which the FET will conduct and current will flow from source-to-drain). Consequently, even though HV-tolerant SGLDMOSFET devices are physically smaller and requires less space than HV-tolerant nMOSFET devices (such as illustrated by FIG. 4), HV-tolerant nMOSFET devices may not be employed for select FETs 60 because of the potential for current to flow through select FETs 60 of non-selected fluid chambers 40 during a sensing operation of a selected fluid chamber by sense circuitry 90, thereby contaminating sense results. However, with source regions (S) of pulldown FETs 62 being connect to ground, according to some examples, such current flow due to the presence of the back body diode will not occur, so that that HV-tolerant SGLDMOSFET devices may be employed for pulldown FETs 62 without adversely impacting sense results of sense circuitry 90. As such, in one example, as illustrated by FIG. 6, HV-tolerant nMOSFET devices (such as illustrated by FIG. 4) are employed for select FETs 60, and smaller (and less costly) HV-tolerant SGLDMOSFET devices are employed for pulldown FETs 62.

Figure 8:
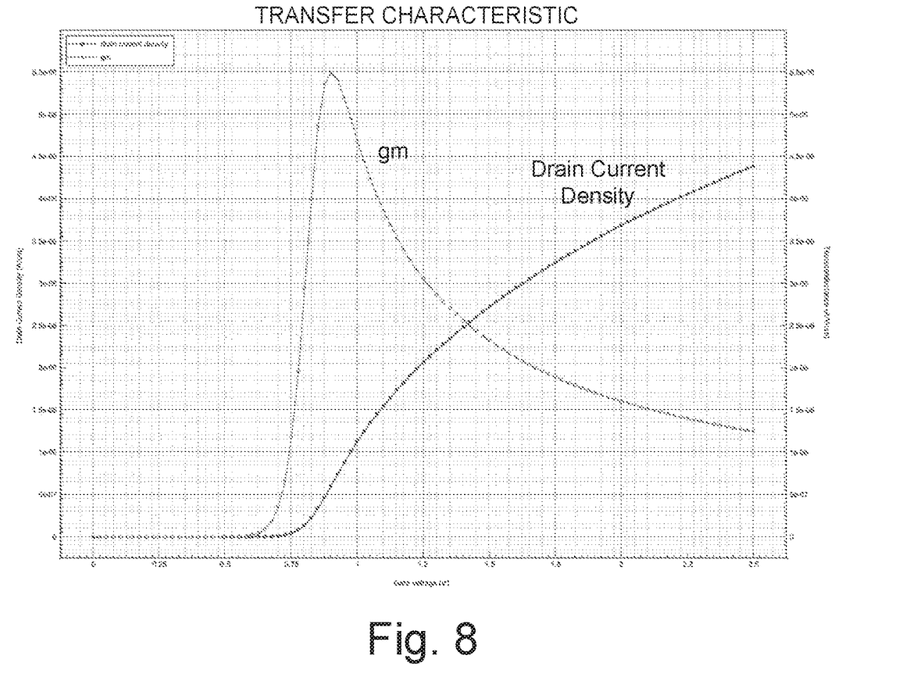
FIG. 8 is a graph illustrating a simulated low-voltage transfer characteristic of a high voltage drain extended MOSFET, according to one example.
Figure 9:
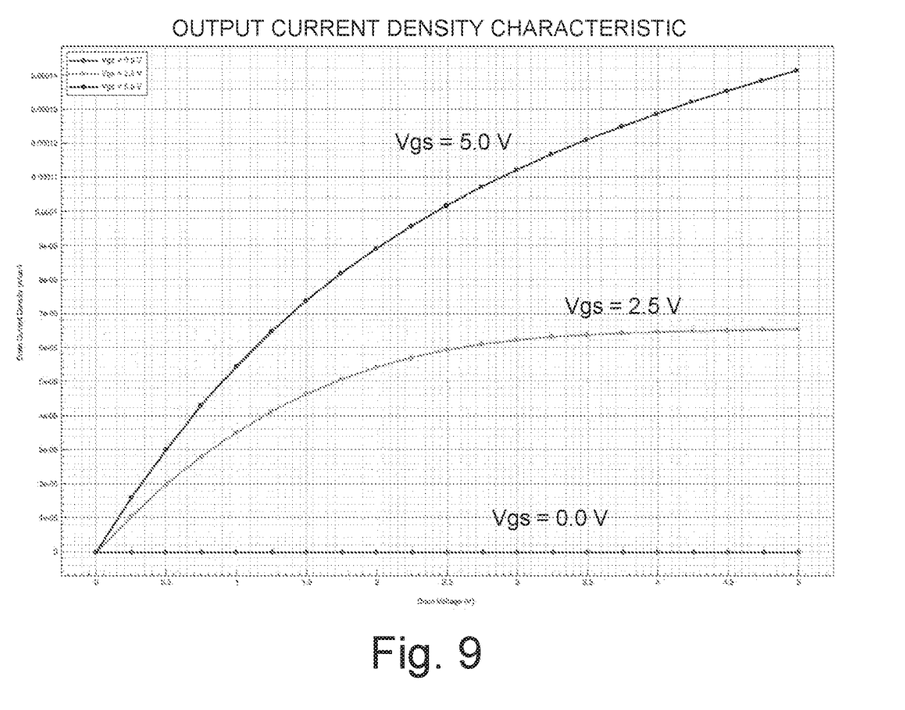
FIG. 9 is a graph illustrating a simulated low-voltage output characteristic of a high voltage drain extended MOSFET, according to one example.
Figure 10:
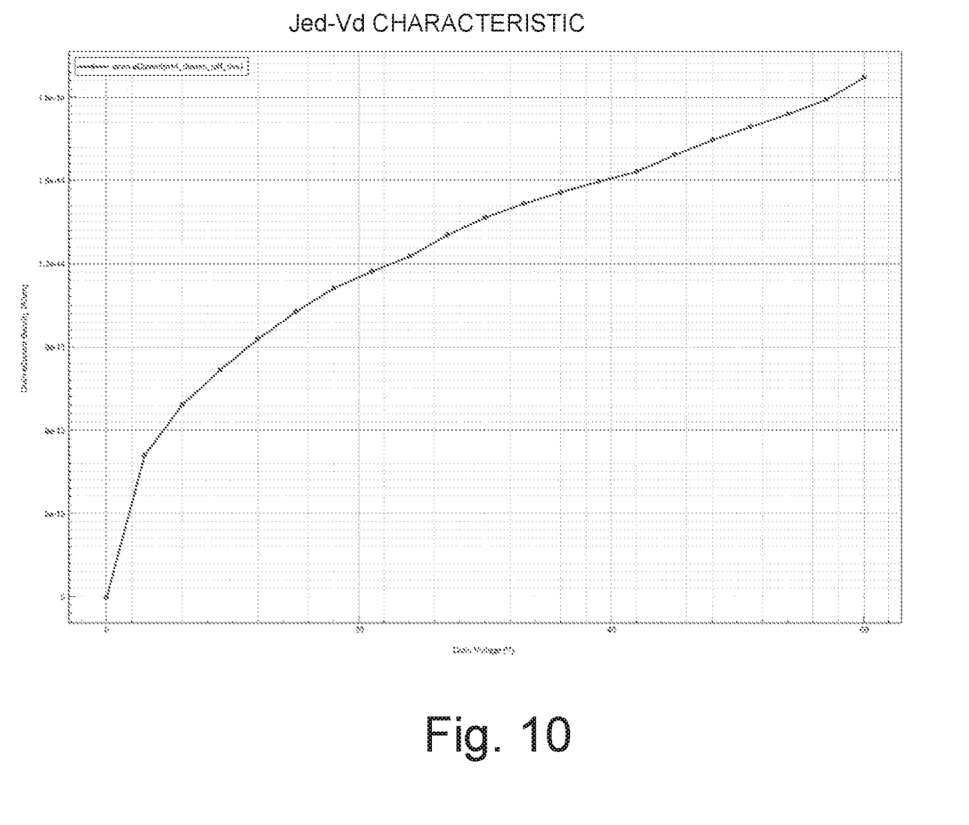
FIG. 10 is a graph illustrating a simulated high-voltage Ioff characteristic of a high voltage drain extended MOSFET, according to one example.

FIGS. 8-10 are graphs illustrating simulated operating characteristics of an HV-tolerant drain-extended nMOSFET, such as illustrated by FIGS. 2 and 4, according to one example. FIG. 8 is a graph illustrating a simulated low-voltage transfer characteristic with a drain-to-source voltage (Vds) at 100 mV. According to such simulation, a voltage VTO (which is synonymous with the threshold voltage, Vth) of the nMOSFET is approximately 0.789 V. In FIG. 8, "gm" represents a transconductance, or a rate of change in the drain current with respect to a gate voltage (Vgs) of the example nMOSFET.

FIG. 9 is a graph illustrating a simulated low-voltage output characteristic of an HV-tolerant drain-extended nMOSFET, according to one example. With a gate voltage (Vgs) of 5.0 V, a drain saturation current, Idsat, of the nMOSFET is approximately 142 µA/µm.

FIG. 10 is a graph illustrating a simulated high-voltage Ioff characteristic of an HV-tolerant drain-extended nMOSFET, according to one example. According to such simulation, the HV-tolerant drain-extended nMOSFET provides high-voltage blocking well beyond 40 V (e.g., beyond a 32 V operating voltage of fluid actuators 44, according to one example).

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

The invention claimed is:

1. A fluidic die comprising:
   a plurality of fluid chambers, each including an electrode exposed to an interior of the fluid chamber and each having a corresponding fluid actuator operating at a first voltage level; and
   monitoring circuitry, operating at a second voltage level lower than the first voltage level, to monitor a condition of each fluid chamber, for each fluid chamber the monitoring circuitry including:
      a select transistor and a pulldown transistor to selectively couple to the electrode, at least the select transistor being a high voltage tolerant transistor to operate at the second voltage in a normal operating condition and having a breakdown voltage level greater than the first voltage level to prevent a fault current from flowing into the select transistor from the electrode in a fault condition if the fluid actuator short-circuits to the electrode.

2. The fluidic die of claim 1, the monitoring circuitry including sense circuitry, the select transistor to selectively couple the sense circuitry to the electrode and the pulldown transistor to selectively couple the electrode to a reference voltage.

3. The fluidic die of claim 1, the select transistor sharing one of a drain and a source region with a select transistor corresponding to an adjacent fluid chamber.

4. The fluidic die of claim 1, the select transistor comprising a high-voltage tolerant drain-extended MOSFET device.

5. The fluidic die of claim 1, the pulldown transistor comprising a low voltage transistor rated for operating at the second voltage.

6. The fluidic die of claim 1, the pulldown transistor comprising a high voltage tolerant transistor having a breakdown voltage greater than the first voltage to prevent a fault current from flowing into the pulldown transistor if the high voltage fluid ejector short-circuits to the electrode.

7. The fluidic die of claim 6, the select transistor and pulldown transistor sharing one of a drain region and a source region which is electrically connected to the electrode.

8. The fluidic die of claim 6, the pulldown transistor sharing one of a drain region and a source region with a pulldown transistor corresponding to an adjacent fluid chamber.

9. The fluidic die of claim 6, the pulldown transistor comprising a high-voltage tolerant drain-extended MOSFET device.

10. The fluidic die of claim 6, the pulldown transistor having a back body diode with an anode connected to one of the source and drain regions and a cathode connected to the other of the source and drain regions, the one of the source and drain regions to which the cathode is connected is electrically connected to the electrode and the other of the source and drain regions is connected to a reference voltage.

11. The fluidic die of claim 10, the reference voltage comprising ground.

12. The fluidic die of claim 10, the other of the source and drain regions shared with a pulldown transistor corresponding to an adjacent fluid chamber.

13. A fluidic die comprising:
   a fluid chamber including an electrode exposed to an interior of the fluid chamber and having a corresponding fluid actuator operating at a high voltage; and
   low-voltage monitoring circuitry including a select transistor and a pulldown transistor to selectively couple to the electrode via a shared drain region connected to the electrode, the select transistor and pulldown transistor each having a breakdown voltage greater than the high voltage to prevent a fault current from flowing into the shared drain region from the electrode if the high voltage fluid actuator short-circuits to the electrode.

14. The fluidic die of claim 13, the select transistor and pulldown transistor each comprising a high voltage tolerant drain-extended MOSFET.

15. A fluidic die comprising:
a plurality of fluid chambers, each including a cavitation plate and having a corresponding fluid actuator operating at a high voltage; and
monitoring circuitry, operating at a low voltage relative to the fluid actuators, to monitor a condition of each fluid chamber, the monitoring circuitry including:
sense circuitry; and
for each fluid chamber:
a select transistor to selectively couple the electrode to the sense circuitry; and
a pulldown transistor to selective couple the electrode to a reference voltage, the select transistor and pulldown transistor each comprising a high-voltage tolerant MOSFET having a breakdown voltage greater than the high voltage of the fluid actuator.

* * * * *